United States Patent
Tsukahara et al.

(10) Patent No.: US 9,258,851 B2
(45) Date of Patent: Feb. 9, 2016

(54) INFORMATION PROCESSING APPARATUS, INFORMATION PROCESSING METHOD, AND PROGRAM

(71) Applicant: Microwave Chemical Co., Ltd., Osaka-shi, Osaka (JP)

(72) Inventors: Yasunori Tsukahara, Osaka (JP); Akinori Ishizuka, Osaka (JP); Yukari Deguchi, Osaka (JP)

(73) Assignee: MICROWAVE CHEMICAL CO., LTD., Osaka-Shi, Osaka (JP)

( * ) Notice: Subject to any disclaimer, the term of this patent is extended or adjusted under 35 U.S.C. 154(b) by 0 days.

(21) Appl. No.: 14/409,616

(22) PCT Filed: Nov. 13, 2013

(86) PCT No.: PCT/JP2013/080624
§ 371 (c)(1),
(2) Date: Dec. 19, 2014

(87) PCT Pub. No.: WO2014/077263
PCT Pub. Date: May 22, 2014

(65) Prior Publication Data
US 2015/0334786 A1    Nov. 19, 2015

(30) Foreign Application Priority Data

Nov. 14, 2012   (JP) .................................. 2012-249856

(51) Int. Cl.
*G06F 19/00*   (2011.01)
*H05B 6/66*    (2006.01)
(Continued)

(52) U.S. Cl.
CPC ................ *H05B 6/666* (2013.01); *G01R 21/00* (2013.01); *H05B 6/6447* (2013.01)

(58) Field of Classification Search
CPC .................. H01L 2924/00; H01L 2924/10253
USPC ........................ 702/183, 182, 184, 185, 188
See application file for complete search history.

(56) References Cited

U.S. PATENT DOCUMENTS

| 5,530,229 A | 6/1996 | Gong et al. |
| 6,133,558 A * | 10/2000 | Ueda ..................... H05B 6/645 |
| | | 219/682 |

(Continued)

FOREIGN PATENT DOCUMENTS

| CN | 1116698 A | 2/1996 |
| CN | 202277700 U | 6/2012 |

(Continued)

OTHER PUBLICATIONS

International Search Report dated Dec. 17, 2013, which issued during prosecution of International Application No. PCT/JP2013/080624, which corresponds to the present application.

(Continued)

*Primary Examiner* — Edward Raymond
(74) *Attorney, Agent, or Firm* — Troutman Sanders LLP

(57) ABSTRACT

An information processing apparatus includes: a supplied electric power value accepting unit accepting a supplied electric power value, which is a difference between an electric power value of microwaves incident on a microwave irradiation apparatus and an electric power value of microwaves reflected by the microwave irradiation apparatus; a temperature accepting unit; an electric energy calculating unit calculating an electric energy corresponding to a microwave irradiation time, using the supplied electric power value; a temperature change calculating unit calculating a temperature change corresponding to the microwave irradiation time, using the accepted temperature; a judging unit, using the electric energy, the temperature change, and a relational expression for associating the electric energy and the temperature change, judging whether the relational expression is satisfied within a tolerable range; and an output unit outputting occurrence of an abnormality, when it is judged that the relational expression is not satisfied within the tolerable range.

8 Claims, 14 Drawing Sheets

(51) Int. Cl.
*G01R 21/00* (2006.01)
*H05B 6/64* (2006.01)

(56) References Cited

U.S. PATENT DOCUMENTS

| | | |
|---|---|---|
| 2002/0067928 A1 | 6/2002 | Nakayama |
| 2006/0228088 A1 | 10/2006 | Charlier De Chily et al. |
| 2010/0018722 A1 | 1/2010 | Hyde et al. |
| 2010/0025227 A1 | 2/2010 | Charlier De Chily et al. |
| 2010/0187224 A1 | 7/2010 | Hyde et al. |
| 2013/0102804 A1 | 4/2013 | Charlier De Chily et al. |

FOREIGN PATENT DOCUMENTS

| | | |
|---|---|---|
| JP | 2002-174983 | 6/2002 |
| JP | 2002-349868 | 12/2002 |
| JP | 2004-095501 | 3/2004 |
| JP | 2006-516008 | 6/2006 |
| JP | 2011-235263 A | 11/2011 |

OTHER PUBLICATIONS

Chinese Office Action issued in corresponding Chinese Patent Application No. 201380024749.3.
Extended European Search Report dated Dec. 2, 2015, issued in corresponding European Application No. 13854874.8.

* cited by examiner

| Time | Supplied electric power value (W) | Temperature (°C) | | Evaporation amount (m³) |
|---|---|---|---|---|
| | | Inlet position | Outlet position | |
| ⋮ | ⋮ | ⋮ | ⋮ | ⋮ |
| T100 | E100 | TE100-1 | TE100-2 | V100 |
| T101 | E101 | TE101-1 | TE101-2 | V101 |
| T102 | E102 | TE102-1 | TE102-2 | V102 |
| T103 | E103 | TE103-1 | TE103-2 | V103 |
| T104 | E104 | TE104-1 | TE104-2 | V104 |
| ⋮ | ⋮ | ⋮ | ⋮ | ⋮ |
| T110 | E110 | TE110-1 | TE110-2 | V110 |

FIG.4

Abnormal

There may be:
  Termal runaway; or
    Decrease in the amount of content.

FIG.5B

Abnormal
There may be:
　Microwave leakage; or
　Increase in the amount of content.

FIG.5C

INFORMATION PROCESSING APPARATUS, INFORMATION PROCESSING METHOD, AND PROGRAM

CROSS-REFERENCE TO RELATED APPLICATIONS

This is a U.S. national phase application under 35 U.S.C. §371 of International Patent Application No. PCT/JP2013/080624, filed on Nov. 13, 2013, and claims benefit of priority to Japanese Patent Application No. JP 2012-249856, filed on Nov. 14, 2012. The International Application was published on May 22, 2014, as International Publication No. WO 2014/077263 under PCT Article 21(2). The entire contents of these applications are hereby incorporated by reference.

TECHNICAL FIELD

The present invention relates to an information processing apparatus and the like for performing judgment regarding an abnormality in a microwave irradiation apparatus.

BACKGROUND

Conventionally, there are known microwave irradiation apparatuses for irradiating microwaves (electromagnetic waves) on a content, thereby performing heating or the like of the content. See, for example, JP 2006-516008A (Tokuhyo).

Conventional heating using a heater is external heating that gradually applies heat from the surface of a material toward the internal portion by thermal conduction, radiation, convection, or the like. Meanwhile, heating using microwaves is characterized in that it is internal heating that causes a material itself to generate heat. The heating using microwaves is further characterized in that it is rapid heating compared with conventional heating using thermal conduction or the like. Since heating using microwaves is internal heating and rapid heating in this manner, it may cause thermal runaway by rapidly heating part of an irradiation target. Also, there is another problem in which such an abnormality cannot be easily detected because the microwave irradiation region is typically shielded and cannot be observed from the outside.

The present invention was arrived at in order to solve the above-described problems, and it is an aspect thereof to provide an information processing apparatus and the like capable of easily judging whether or not an abnormality related to microwaves has occurred in a microwave irradiation apparatus.

SUMMARY

In order to achieve the above-described aspect, the present invention is directed to an information processing apparatus for performing judgment regarding an abnormality in a microwave irradiation apparatus for irradiating microwaves on a content. The information processing apparatus includes: a supplied electric power value accepting unit that accepts a supplied electric power value to the microwave irradiation apparatus, which is a difference between an electric power value of incident waves that are microwaves incident on an irradiation region of the microwave irradiation apparatus and an electric power value of reflected waves that are microwaves reflected by the irradiation region of the microwave irradiation apparatus; a temperature accepting unit that accepts a temperature of the content; an electric energy calculating unit that calculates an electric energy corresponding to a microwave irradiation time, using the supplied electric power value accepted by the supplied electric power value accepting unit; a temperature change calculating unit that calculates a temperature change corresponding to the microwave irradiation time, using the temperature accepted by the temperature accepting unit; a judging unit that, using the electric energy calculated by the electric energy calculating unit, the temperature change calculated by the temperature change calculating unit, and a relational expression for associating the electric energy and the temperature change, judges whether or not the relational expression is satisfied within a tolerable range by the electric energy and the temperature change; and an output unit that performs output regarding occurrence of an abnormality, in a case where it is judged by the judging unit that the relational expression is not satisfied within the tolerable range by the electric energy and the temperature change.

With this configuration, it is possible to judge whether or not an abnormality has occurred in a microwave irradiation apparatus, using information such as supplied electric power value that can be acquired in the microwave irradiation apparatus. As a result, for example, if an abnormality has occurred, the abnormality can be dealt with.

Furthermore, the information processing apparatus according to the present invention may be configured such that the information processing apparatus further includes: an evaporation amount accepting unit that accepts an evaporation amount of the content in the irradiation region of the microwave irradiation apparatus; and a decrease amount calculating unit that calculates a decrease amount of the content due to evaporation, corresponding to the microwave irradiation time, using the evaporation amount accepted by the evaporation amount accepting unit; wherein the relational expression is for associating the electric energy, the temperature change, and the decrease amount, the judging unit, using the electric energy calculated by the electric energy calculating unit, the temperature change calculated by the temperature change calculating unit, the decrease amount calculated by the decrease amount calculating unit, and the relational expression, judges whether or not the relational expression is satisfied within the tolerable range by the electric energy, the temperature change, and the decrease amount, and the output unit performs the output, in a case where it is judged by the judging unit that the relational expression is not satisfied within the tolerable range by the electric energy, the temperature change, and the decrease amount.

With this configuration, it is possible to perform judgment regarding an abnormality also using the evaporation amount of the content, thereby realizing more accurate judgment.

Furthermore, the information processing apparatus according to the present invention may be configured such that the microwave irradiation apparatus is of a continuous-type, the temperature accepting unit accepts a temperature of the content at an inlet position of the microwave irradiation apparatus and a temperature of the content at an outlet position thereof, the temperature change calculating unit calculates the temperature change, which is a difference between the temperature of the content at the outlet position and the temperature of the content at the inlet position, and the microwave irradiation time is a time during which the content flows in the irradiation region of the microwave irradiation apparatus.

With this configuration, it is possible to perform judgment regarding an abnormality in a continuous-type microwave irradiation apparatus.

Furthermore, the information processing apparatus according to the present invention may be configured such that the microwave irradiation apparatus is of a batch-type, the temperature change calculating unit calculates the temperature change, which is a difference between the temperature after the temperature increases at an end of the microwave irradiation time and the temperature before the temperature increases at a start of the microwave irradiation time.

With this configuration, it is possible to perform judgment regarding an abnormality in a batch-type microwave irradiation apparatus.

The information processing apparatus and the like according to the present invention can perform judgment regarding an abnormality in a microwave irradiation apparatus. As a result, for example, it is possible to detect occurrence of an abnormality.

BRIEF DESCRIPTION OF DRAWINGS

FIG. 4 is a table showing an example of the supplied electric power value and the like according to this example.

FIG. 5B is a view showing exemplary output according to this example.

FIG. 5C is a view showing exemplary output according to this example.

DETAILED DESCRIPTION

Figure 1:
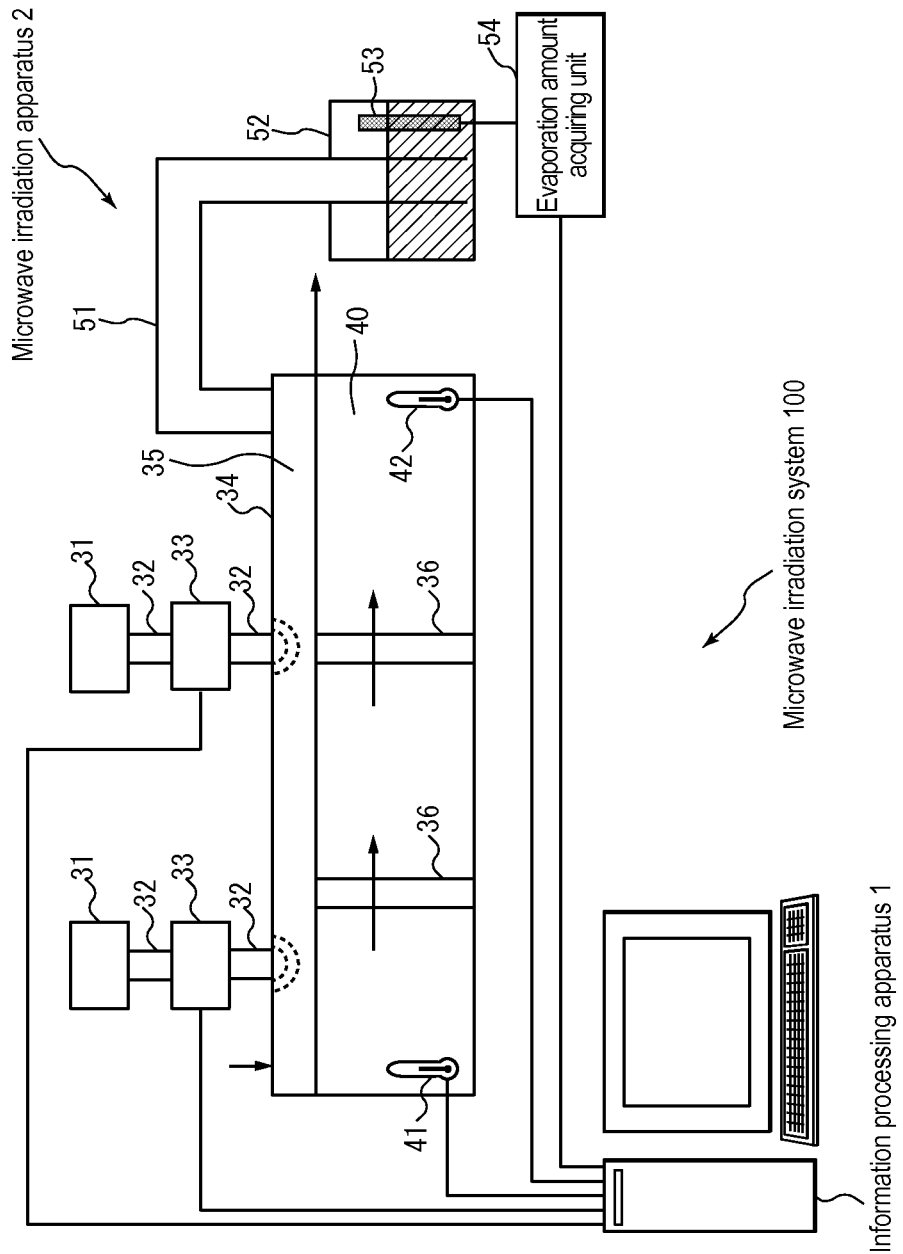
FIG. 1 is a diagram showing the configuration of a microwave irradiation system according to an example of the present invention.

Hereinafter, an information processing apparatus according to the present invention will be described by way of examples. Note that constituent elements and steps denoted by the same reference numerals are the same or similar to each other in the following examples, and, thus, a description thereof may not be repeated.

Example

Hereinafter, a microwave irradiation system according to an example of the present invention will be described with reference to the drawings. The microwave irradiation system according to this example includes a microwave irradiation apparatus, and an information processing apparatus for performing judgment regarding occurrence of an abnormality in the microwave irradiation apparatus.

FIG. 1 is a diagram showing the configuration of a microwave irradiation system 100 according to this example. The microwave irradiation system 100 according to this example includes an information processing apparatus 1 and a microwave irradiation apparatus 2. The information processing apparatus 1 performs judgment regarding occurrence of an abnormality in the microwave irradiation apparatus 2. The abnormality refers to a state in which microwave irradiation is not properly performed, such as thermal runaway, microwave leakage, an unexpected decrease or increase in the amount of microwave irradiation target, or the like. The microwave irradiation apparatus 2 irradiates microwaves on a content. The irradiation is performed, for example, in order to heat the content, or to cause other reactions. The microwave irradiation apparatus 2 may be, for example, of a batch-type or a continuous-type. The continuous-type microwave irradiation apparatus 2 may be considered to include those of a conveyor-type in which a content is conveyed by a conveyor. In this example, a case will be mainly described in which the microwave irradiation apparatus 2 is of a continuous-type.

In FIG. 1, the microwave irradiation apparatus 2 includes microwave generators 31, waveguides 32, power monitors 33, a reactor 34, a vapor guide tube 51, a condensing vessel 52, a liquid surface sensor 53, and an evaporation amount acquiring unit 54.

The microwave generators 31 generate microwaves. The microwave irradiation apparatus 2 according to this example may include one microwave generator 31, or may include two or more microwave generators 31. There is no limitation on the frequency of the microwaves, and examples thereof include 2.45 GHz, 5.8 GHz, 24 GHz, 913 MHz, and other frequencies ranging from 300 MHz to 300 GHz. If the microwave irradiation apparatus 2 includes two or more microwave generators 31, the microwaves generated by the respective microwave generators 31 may have the same frequency or different frequencies. Furthermore, the power of the microwave generators 31 may be controlled by an unshown control unit according to the temperature inside the reactor 34 or the like.

The waveguides 32 transmit the microwaves generated by the microwave generators 31 to the reactor 34. Note that the specification of the waveguides 32 is preferably in accordance with the frequency of the microwaves generated by the microwave generators 31.

The power monitors 33 acquire an electric power value of the incident waves and an electric power value of the reflected waves. The incident waves are microwaves incident on the reactor 34, which is a microwave irradiation region of the microwave irradiation apparatus 2. That is to say, the incident waves are traveling waves oriented toward the irradiation region. The reflected waves are microwaves reflected by the reactor 34, which is a microwave irradiation region of the microwave irradiation apparatus 2. That is to say, the reflected waves are microwaves oriented from the irradiation region toward the microwave generators 31. Although not shown in FIG. 1, isolators that allow the incident waves to pass therethrough but absorb the reflected waves may be provided between the power monitors 33 and the microwave generators 31. The electric power value of the incident waves and the electric power value of the reflected waves acquired by the power monitors 33 are passed to the information processing apparatus 1.

The reactor 34 is a horizontal continuous-type (flow-type) reaction unit in which a content 40 horizontally flows with an unfilled space 35 being provided thereabove. Since microwaves are irradiated on the content 40 in the reactor 34, the reactor 34 functions as a microwave irradiation region. For example, the content 40 may be only a raw material, or may be a mixture of a raw material and a catalyst. Note that, if the microwave irradiation in the reactor 34 causes a chemical reaction, a product material is produced from the raw material, and, thus, the content 40 of the reactor 34 may be considered to contain the product material. That is to say, the content 40 may be the raw material and/or the product material. Furthermore, the content 40 that flows through the reactor 34 is preferably flowable inside the reactor 34, and, thus, the content 40 is preferably a material other than solid (e.g., powders or grains, etc.). Accordingly, the content 40 may be liquid. The liquid content 40 may be, for example, a material having a high flowability such as water, oil, aqueous solution, or colloidal solution, or may be a material having a low flowability such as slurry or suspension. The inner wall of the reactor 34 is preferably made of a microwave-reflecting material. Examples of the microwave-reflecting material include metal. If the content 40 contains a catalyst, the catalyst may be a solid catalyst (heterogeneous catalyst), or may be a liquid catalyst (homogeneous catalyst). The solid catalyst may or may not be, for example, microwave-absorbing or microwave-sensitive. In the case where the solid catalyst is microwave-absorbing or microwave-sensitive, if microwaves are irradiated inside the reactor 34, the solid catalyst is heated by the microwaves, and the heating near the solid catalyst is facilitated.

Furthermore, as shown in FIG. 1, the reactor 34 may have temperature measuring units 41 and 42. The temperature inside the reactor 34 is preferably the temperature of the content 40 in the reactor 34. Although FIG. 1 shows a case in which the temperature measuring units 41 and 42 are arranged at the inlet position of the content 40 and the outlet position of the content 40 in the reactor 34, the temperature measuring units 41 and 42 may be arranged also at other positions. The temperature measuring units 41 and 42 may measure the temperature, for example, using a thermocouple, an infrared sensor, an optical fiber, or other methods. The temperature (strictly speaking, data indicating the temperature) measured by the temperature measuring units 41 and 42 is passed to the information processing apparatus 1. Furthermore, the temperature may be passed to an unshown microwave control unit, and be used to control the power of microwaves. This control may be, for example, control for keeping the temperature inside the reactor 34 at a desired temperature or in a desired temperature range.

The inside of the reactor 34 is partitioned by partition plates 36 into three chambers. The content 40 flows from a chamber on the upstream side (the left side in FIG. 1) to a chamber on the downstream side (the right side in FIG. 1). The multiple chambers are chambers that are continuously arranged in series. As described above, there is the unfilled space 35 in the upper portion inside the reactor 34. The unfilled space 35 is irradiated with the microwaves via the waveguides 32. FIG. 1 shows a case in which microwaves are irradiated on the unfilled space 35 of the reactor 34, but there is no limitation to this. If there is no unfilled space 35 inside the reactor 34, that is, if the inside of the reactor 34 is filled with the content 40, microwaves may be directly irradiated on the content 40. There is no limitation on the positions at which the waveguides 32 are connected to the reactor 34. For example, the waveguides 32 may be provided respectively at the positions around the middle in the chambers, at the positions of the partition plates 36, or other positions. If the unfilled space 35 is shared by multiple chambers, the microwaves that have been transmitted to the shared unfilled space 35 are irradiated on the content 40 in the multiple chambers sharing the unfilled space 35. The partition plates 36 may transmit microwaves, may absorb microwaves, or may reflect microwaves. Examples of the microwave-transmitting material include Teflon (registered trademark), quartz glass, ceramic, silicon nitride-alumina, and the like. Furthermore, examples of the microwave-absorbing material include carbon except for fullerene, and the like. Furthermore, examples of the microwave-reflecting material include metal. Note that a flow path that allows the content 40 to flow is formed at the partition plates 36. The flow path at the partition plates 36 may be, for example, a flow path that allows the content 40 to flow over the partition plates 36, or may be a flow path that allows the content 40 to flow through voids at the partition plates 36. In the latter case (i.e., in the case of a flow path through voids), for example, the flow path through voids may be present between the partition plates 36 and the inner wall of the reactor 34, or in the partition plates 36 themselves.

Furthermore, an unshown agitation unit may be provided inside the reactor 34. That is to say, the microwave irradiation apparatus 2 according to this example may further have one or more agitation units that rotationally agitate the content 40 inside the reactor 34. The agitation may be performed, for example, by rotating a blade-like, wing-like, or rod-like rotatable member. The rotatable member may be made of a microwave-transmitting material, a microwave-absorbing material, a microwave-reflecting material, or a combination of two or more freely selected from the microwave-transmitting material, the microwave-absorbing material, and the microwave-reflecting material.

The vapor guide tube 51 is a tube that, when vapor (gas) is generated by the microwave irradiation in the reactor 34, guides the generated vapor to the condensing vessel 52. The vapor guide tube 51 is preferably configured such that leakage of vapor does not occur at its joint portions with the reactor 34 and with the condensing vessel 52. The reason for this is to make it possible to acquire an accurate vapor amount using the condensing vessel 52 and the like. Furthermore, in order to prevent microwaves from leaking via the vapor guide tube 51, the diameter, the length, and the like of the vapor guide tube 51 are preferably set such that the vapor guide tube 51 hardly allows microwaves irradiated in the reactor 34 to pass therethrough.

The condensing vessel 52 is a vessel that condenses (liquefies) the vapor guided by the vapor guide tube 51. As shown in FIG. 1, the vapor guided by the vapor guide tube 51 may be liquefied by guiding the vapor into the liquid obtained by condensation. The condensing vessel 52 may be cooled down as appropriate by a cooler such that the liquefaction is properly performed. Furthermore, the condensing vessel 52 includes the liquid surface sensor 53 that measures the liquid surface position of liquid obtained by the liquefaction. The information of the liquid surface position measured by the liquid surface sensor 53 is passed to the evaporation amount acquiring unit 54.

The evaporation amount acquiring unit 54 acquires an evaporation amount of the content 40 in accordance with a change in the liquid surface position received from the liquid surface sensor 53. The evaporation amount may be, for example, an evaporation amount per unit period, or may be an integrated evaporation amount. The unit period is a predetermined period corresponding to the unit of processing, and may be, for example, 1 second, 10 seconds, 1 minute, 5 minutes, or the like. The evaporation amount acquiring unit 54 may acquire an evaporation amount per unit period, for example, by multiplying the horizontal cross-sectional area in the condensing vessel 52 and the amount of change in the liquid level per unit period. Furthermore, the evaporation amount may or may not be an amount in the same phase as the content 40. In the former case, if the content 40 is liquid, the evaporation amount is an amount of liquid. Furthermore, the amount may be in volume, weight, number of moles, or other amounts. In this example, a case will be mainly described in which the evaporation amount is in volume. Furthermore, the evaporation amount acquiring unit 54 may acquire an integrated evaporation amount, for example, by multiplying the horizontal cross-sectional area in the condensing vessel 52 and the amount of change in the liquid level from the start of processing. The start of processing may be, for example, the start of microwave irradiation. Furthermore, the acquired evaporation amount is passed to the information processing apparatus 1. In this example, it is assumed that the evaporation amount is passed to the information processing apparatus 1 per unit period.

Hereinafter, an operation of the microwave irradiation apparatus 2 will be briefly described. When the content 40 such as a raw material flows into the reactor 34, the content 40 is irradiated with microwaves while sequentially moving from chamber to chamber. Accordingly, a reaction in accordance with the microwave irradiation occurs as appropriate, and the content 40 containing a product material after the reaction flows out of the reactor 34. Note that, inside the reactor 34, the content 40 is preferably agitated using an unshown agitation unit so as to be uniformly irradiated with microwaves. Furthermore, the microwave irradiation may be performed in order to perform a processing other than the chemical reaction. For example, heating in accordance with the microwave irradiation may be performed to melt a thermally melting adhesive, to dry a wet irradiation target, to cause distillation, or to perform other processing.

Note that, if the content 40 contains a catalyst, a catalyst separating portion (not shown) for separating the catalyst may be provided on the path after the reactor 34. Although FIG. 1 shows a case in which the inside of the reactor 34 is partitioned by the partition plates 36 into three chambers, the number of chambers inside the reactor 34 may be two, or may be four or more, or the inside of the reactor 34 may not be partitioned. Also, FIG. 1 shows a case in which the reactor 34 is of a horizontal flow-type, but there is no limitation to this. The reactor 34 may be of a vertical flow-type in which the content vertically flows. Furthermore, there is no limitation on the type of the content 40. The content 40 is typically liquid, but may be solid or gas. If the content 40 is solid, the content 40 itself may move inside the reactor 34, or the content 40 may be moved by a conveyor or the like as in a conveyor-type apparatus. Furthermore, if the content 40 is gas, there is no unfilled space inside the reactor 34. In this manner, the microwave irradiation apparatus 2 may be any apparatus, as long as an irradiation target is irradiated with microwaves in an irradiation region.

Figure 2:
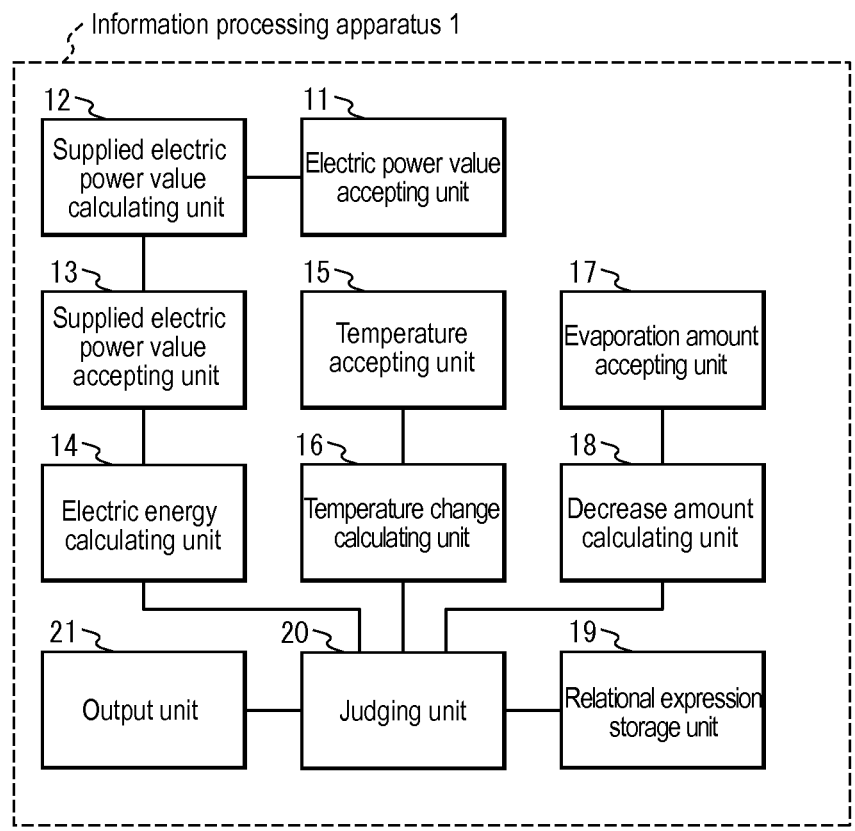
FIG. 2 is a block diagram showing the configuration of an information processing apparatus according to this example.

FIG. 2 is a block diagram showing the configuration of the information processing apparatus 1 according to this example. In FIG. 2, the information processing apparatus 1 according to this example performs judgment regarding an abnormality in the microwave irradiation apparatus 2 for irradiating microwaves on the content 40, and includes an electric power value accepting unit 11, a supplied electric power value calculating unit 12, a supplied electric power value accepting unit 13, an electric energy calculating unit 14, a temperature accepting unit 15, a temperature change calculating unit 16, an evaporation amount accepting unit 17, a decrease amount calculating unit 18, a relational expression storage unit 19, a judging unit 20, and an output unit 21.

The electric power value accepting unit 11 accepts the electric power value of the incident waves and the electric power value of the reflected waves acquired by the power monitors 33. Note that the electric power value accepting unit 11 may or may not include an accepting device (e.g., a network card, etc.). Furthermore, the electric power value accepting unit 11 may be realized by hardware, or may be realized by software such as a driver for driving a predetermined device.

The supplied electric power value calculating unit 12 calculates a supplied electric power value, which is a difference between the electric power value of the incident waves and the electric power value of the reflected waves accepted by the electric power value accepting unit 11. The supplied electric power value indicates an electric power value of microwaves supplied to the irradiation region of the microwave irradiation apparatus 2. If the electric power value accepting unit 11 accepts electric power values from multiple power monitors 33, the supplied electric power value calculating unit 12 may calculate a supplied electric power value at each power monitor 33, or may calculate the total of supplied electric power values at all power monitors 33. In this example, the latter case will be mainly described. Furthermore, there is no limitation on the time at which the supplied electric power value calculating unit 12 calculates a supplied electric power value, but, in this example, a case will be mainly described in which the supplied electric power value calculating unit 12 calculates a supplied electric power value on a regular basis, that is, calculates a supplied electric power value per unit period.

The supplied electric power value accepting unit 13 accepts the supplied electric power value to the microwave irradiation apparatus 2, which is a difference between the electric power value of the incident waves that are microwaves incident on the irradiation region of the microwave irradiation apparatus 2 and the electric power value of the reflected waves that are microwaves reflected by the irradiation region of the microwave irradiation apparatus 2. The supplied electric power value is calculated by the supplied electric power value calculating unit 12. Note that the supplied electric power value accepting unit 13 may or may not include an accepting device (e.g., a modem, a network card, etc.). The supplied electric power value accepting unit 13 may be realized by hardware, or may be realized by software such as a driver for driving a predetermined device.

The electric energy calculating unit 14 calculates an electric energy corresponding to the microwave irradiation time, using the supplied electric power value accepted by the supplied electric power value accepting unit 13. If the supplied electric power value continuously changes, the electric energy calculating unit 14 may calculate an electric energy by integrating supplied electric power values from the start to the end of the irradiation period in the microwave irradiation time. Furthermore, if the supplied electric power value is information per unit period, the electric energy calculating unit 14 may calculate an electric energy, by adding supplied electric power values per unit period from the start to the end of the irradiation period in the microwave irradiation time, and multiplying unit period by the addition result. If the electric energy is calculated by integration or addition, for example, the supplied electric power value accepted by the supplied electric power value accepting unit 13 may be accumulated in an unshown storage medium, and the electric energy calculating unit 14 may calculate an electric energy by integrating or adding supplied electric power values in periods corresponding to the microwave irradiation time, from among the accumulated supplied electric power values. On the other hand, if the supplied electric power value does not change in the microwave irradiation time, the electric energy calculating unit 14 may calculate an electric energy by multiplying the microwave irradiation time and the supplied electric power value. In this case, for example, the microwave irradiation time may be stored in an unshown storage medium, and the electric energy calculating unit 14 may calculate an electric energy by calculating a product of the microwave irradiation time read therefrom and the supplied electric power value. The microwave irradiation time is a time during which microwaves are irradiated on an irradiation target. If the reactor 34 is of a continuous-type as in this example, the microwave irradiation time is a time during which the content 40 flows in the irradiation region of the microwave irradiation apparatus 2, that is, a time from when the content 40 flows into the irradiation region (the reactor 34) to when the content 40 flows out thereof. The time from when the content 40 flows into the irradiation region to when the content 40 flows out thereof is typically equal to the time during which the content 40 moves from the temperature measuring unit 41 to the temperature measuring unit 42.

The temperature accepting unit 15 accepts temperatures of the content 40 from the temperature measuring units 41 and 42. If the reactor 34 is of a continuous-type as in this example, the temperature accepting unit 15 accepts the temperature of the content 40 at the inlet position and the temperature of the content 40 at the outlet position in the microwave irradiation apparatus 2. The former temperature is measured by the temperature measuring unit 41, and the latter temperature is measured by the temperature measuring unit 42. Each of the temperatures may be, for example, a temperature measured by one temperature measuring unit, or may be an average of temperatures measured by two or more temperature measuring units. In the latter case, for example, the temperature accepting unit 15 may accept an average of temperatures measured by multiple temperature measuring units at the inlet position and an average of temperatures measured by multiple temperature measuring units at the outlet position. Note that the temperature accepting unit 15 may or may not include an accepting device (e.g., a network card, etc.). Furthermore, the temperature accepting unit 15 may be realized by hardware, or may be realized by software such as a driver for driving a predetermined device.

The temperature change calculating unit 16 calculates a temperature change corresponding to the microwave irradiation time, using the temperatures accepted by the temperature accepting unit 15. That is to say, the temperature change calculating unit 16 calculates a temperature change by subtracting the temperature at the start from the temperature at the end in the microwave irradiation time. If the reactor 34 is of a continuous-type as in this example, the temperature change calculating unit 16 calculates the temperature change, which is a difference between the temperature of the content 40 at the outlet position and the temperature of the content 40 at the inlet position. The former temperature is measured by the temperature measuring unit 42, and the latter temperature is measured by the temperature measuring unit 41. In this manner, a temperature change obtained by subtracting the temperature at the inlet position from the temperature at the outlet position in the microwave irradiation region (the reactor 34) is calculated. Note that the temperature at the temperature measuring unit 41 used for calculating the temperature change is measured preferably earlier by the microwave irradiation time than when the temperature is measured by the temperature measuring unit 42. Accordingly, the temperature change calculated by the temperature change calculating unit 16 indicates a level of an increase in the temperature of the content 40 in the microwave irradiation time.

The evaporation amount accepting unit 17 accepts the evaporation amount of the content in the irradiation region (the reactor 34) of the microwave irradiation apparatus 2, from the evaporation amount acquiring unit 54. Note that the evaporation amount accepting unit 17 may or may not include an accepting device (e.g., a modem, a network card, etc.). The evaporation amount accepting unit 17 may be realized by hardware, or may be realized by software such as a driver for driving a predetermined device.

The decrease amount calculating unit 18 calculates a decrease amount of the content 40 due to evaporation, using the evaporation amount accepted by the evaporation amount accepting unit 17. The decrease amount is preferably an amount in the same phase (e.g., a solid phase, a liquid phase, a gas phase, etc.) as the content 40, but there is no limitation to this. Furthermore, the decrease amount is a decrease amount corresponding to the microwave irradiation time. The microwave irradiation time is the same as the microwave irradiation time used for calculating the electric energy and the like. That is to say, if the reactor 34 is of a continuous-type as in this example, the microwave irradiation time is a time from when the content 40 flows into the irradiation region (the reactor 34) to when the content 40 flows out thereof. If the evaporation amount is an amount per unit period, the decrease amount calculating unit 18 may calculate a total evaporation amount corresponding to the microwave irradiation time, by adding each evaporation amount corresponding to the microwave irradiation time. For example, if the evaporation amounts accepted by the evaporation amount accepting unit 17 are accumulated in an unshown storage medium, the decrease amount calculating unit 18 may calculate a total evaporation amount by adding evaporation amounts in periods corresponding to the microwave irradiation time, from among the accumulated evaporation amounts. Furthermore, if the evaporation amount is an accumulated amount, the decrease amount calculating unit 18 may calculate a total evaporation amount by subtracting the accumulated amount at the start from the accumulated amount at the end in the microwave irradiation time. For example, if the evaporation amounts accepted by the evaporation amount accepting unit 17 are accumulated in an unshown storage medium, the decrease amount calculating unit 18 may calculate a total evaporation amount by subtracting the evaporation amount (accumulated amount) at the start from the evaporation amount (accumulated amount) at the end in the microwave irradiation time, from which a decrease amount is to be calculated, from among the accumulated evaporation amounts. If the evaporation amount and the decrease amount have the same unit, the total evaporation amount is the decrease amount. On the other hand, if the evaporation amount and the decrease amount have different units, the decrease amount calculating unit 18 converts the total evaporation amount into the decrease amount. For example, the total evaporation amount is typically represented as a volume, but the unit of the decrease amount may be a unit in volume, a unit in weight, a unit in number of moles, or may be other units. Accordingly, the decrease amount calculating unit 18 may converts the unit. For example, if the density is multiplied by the total evaporation amount in volume, the weight can be calculated. Furthermore, if the weight is divided by the mass per mole, the number of moles can be calculated. In this example, a case will be mainly described in which the decrease amount calculating unit 18 converts the total evaporation amount into the number of moles.

In the relational expression storage unit 19, a relational expression is stored. The relational expression is an expression for associating the electric energy, the temperature change, and the decrease amount. If the relational expression is satisfied, microwave irradiation is properly performed in the microwave irradiation apparatus 2. The relational expression will be described later in detail. There is no limitation on the procedure in which the relational expression is stored in the relational expression storage unit 19. For example, the relational expression may be stored in the relational expression storage unit 19 via a storage medium, the relational expression transmitted via a communication line or the like may be stored in the relational expression storage unit 19, or the relational expression input via an input device may be stored in the relational expression storage unit 19. In the relational expression storage unit 19, the information may be temporarily stored in a RAM or the like, or may be stored for a long period of time. The relational expression storage unit 19 may be realized by a predetermined storage medium (e.g., a semiconductor memory, a magnetic disk, an optical disk, etc.).

The judging unit 20, using the electric energy calculated by the electric energy calculating unit 14, the temperature change calculated by the temperature change calculating unit 16, the decrease amount calculated by the decrease amount calculating unit 18, and the relational expression stored in the relational expression storage unit 19, judges whether or not the relational expression is satisfied within a tolerable range by the electric energy, the temperature change, and the decrease amount. As described later, typically, the relational expression is satisfied by the electric energy, the temperature change, and the decrease amount in an ideal status with no abnormality. However, the microwave irradiation and the like are not always performed in such an ideal status, and, thus, the judging unit 20 judges that the relational expression is satisfied also in the case where the relational expression is satisfied within the tolerable range by the electric energy and the like. Accordingly, the tolerable range is typically a range corresponding to tolerable errors. That is to say, the judging whether or not the relational expression is satisfied within the tolerable range by the electric energy, the temperature change, and the decrease amount may be considered as judging whether or not the relational expression is satisfied within the error range by the electric energy, the temperature change, and the decrease amount. The tolerable range may be fixed or may be changed in accordance with the content 40. For example, in the case where the content 40 is a mixture of a raw material and a product material, if the difference between their relative permittivities is large, the tolerable range may be increased, and, if the difference between their relative permittivities is small, the tolerable range may be reduced.

The output unit 21 performs output regarding occurrence of an abnormality, if the judging unit 20 judges that the relational expression is not satisfied within the tolerable range by the electric energy, the temperature change, and the decrease amount. The output regarding occurrence of an abnormality may be output indicating that there is an abnormality, may be output indicating the content of an abnormality, may be output regarding control according to the occurrence of an abnormality, or may be other output regarding occurrence of an abnormality. The output regarding control according to the occurrence of an abnormality may be, for example, output regarding control to lower the power of the microwave generators 31 or to stop the power according to the occurrence of an abnormality, or may be output regarding other control. Note that the output unit 21 may perform output indicating that there is no abnormality if it is judged that the relational expression is satisfied within the tolerable range by the electric energy and the like. The output may be, for example, displaying on a display device (e.g., a CRT, a liquid crystal display, etc.), transmission via a communication line to a predetermined device, printing using a printer, output of a sound using a loudspeaker, accumulation in a storage medium, or delivery to another constituent element. Note that the output unit 21 may or may not include an output device (e.g., a display device, a printer, etc.). The output unit 21 may be realized by hardware, or may be realized by software such as a driver for driving a device therefor.

Hereinafter, the relational expression will be described. Before the description, first, (1) the case in which an increase in the temperature is caused by microwave irradiation and (2) the case in which evaporation is caused by microwave irradiation will be described.

(1) Increase in Temperature

If an increase in the temperature is caused by microwave irradiation, the relation as represented by the following expression is satisfied.

$$\Delta E_1 \times \Delta t_1 = \chi \times M \times \Delta T \qquad \text{Expression 1}$$

where $\Delta E_1$ (W=J/s) is a supplied electric power value, $\Delta t_1$ (s) is a time during which microwaves are irradiated for increasing the temperature, according to the supplied electric power value, $\chi$(J/(kg·K)) is a total specific heat of a microwave irradiation target, M (kg) is a total mass of a microwave irradiation target, and $\Delta T$ (K) is an increase in the temperature according to the time in which microwaves are irradiated.

(2) Evaporation

If evaporation is caused by microwave irradiation, the relation as represented by the following expression is satisfied.

$$\Delta E_2 \times \Delta t_2 = \alpha \times H \times N \qquad \text{Expression 2}$$

where $\Delta E_2$ (W) is a supplied electric power value, $\Delta t_2$ (s) is a time during which microwaves are irradiated for causing evaporation, according to the supplied electric power value, $\alpha$ is a coefficient, H (J) is an enthalpy of vaporization (heat of vaporization) of an evaporated material, and N is the number of moles of an evaporated material.

If processing in a steady state is performed with microwave irradiation in the continuous-type microwave irradiation apparatus 2, the following expression is satisfied. The steady state is a state in which (1) and (2) above concurrently occur at a constant proportion.

$$\Delta E \times \Delta t = A \times \Delta T + B \times N + C \qquad \text{Expression 3}$$

where $\Delta E$ (W) is a supplied electric power value, $\Delta t$ (s) is a time during which microwaves are irradiated according to the supplied electric power value, A, B, and C are coefficients, and the others are as described above. C is a term added in consideration of, for example, reaction heat generated by a reaction inside the reactor 34, and microwaves absorbed by the reactor 34, the partition plates 36, the agitation unit, or the like. A, B, and C are values measured when the microwave irradiation apparatus 2 is in a proper steady state (with no abnormality). It seems that "A=$\chi \times$M" or "B=$\alpha \times$H" from (1), but "A=$\chi \times$M" and the like may not be actually satisfied due to errors or the like, and, thus, A and the like are preferably measured in an experiment or the like than obtained by calculation. Hereinafter, the C term in Expression 3 will be described. C can be represented as follows.

$$C = -C1 + C2 + C3$$

where C1 is reaction heat generated by a reaction inside the reactor 34 in the microwave irradiation time. If an exothermic reaction occurs inside the reactor 34, C1>0, and, if an endothermic reaction occurs, C1<0. Furthermore, if both reactions occur, a positive or negative sign of C1 is determined according to the exothermic and endothermic levels. C1 can be calculated by multiplying the quantity (e.g., the number of moles) of a reacted material inside the reactor 34 by the reaction heat per unit quantity (e.g., per mole) of a reaction caused inside the reactor 34. If multiple reactions occur, C1 is the total of reaction heats generated in the respective reactions. Note that, if no exothermic reaction or endothermic reaction occurs inside the reactor 34 (e.g., drying or the like is performed), C1 may be set to 0. Furthermore, C2 is a term according to microwave absorption by the reactor 34, the partition plates 36, structures inside the reactor 34 such as the agitation unit, impurities inside the waveguides 32 between the power monitors 33 and the reactor 34, and the like in the microwave irradiation time. If such absorption occurs, C2>0. If the reactor 34, the partition plates 36, or the like is made of a microwave-reflecting or microwave-transmitting material, that is, if microwave absorption is substantially negligible, C2 may be set to 0. Furthermore, C3 is a term according to an increase or decrease in other energy in the microwave irradiation time. The increase or decrease in the energy may be, for example, flow-in or flow-out of heat via the wall of the reactor 34 or the like. In the case where C3 is a term according to flow-in or flow-out of heat, if heat flows in, C3<0, and, if heat flows out, C3>0. If heat does not flow in or out, C3 may be set to 0. Note that A and B are typically coefficients that are not 0. Meanwhile, C may be 0, or may not be 0. Expression 3 above is the relational expression stored in the relational expression storage unit 19. $\Delta E \times \Delta t$ is an electric energy calculated by the electric energy calculating unit 14, $\Delta T$ is a temperature change calculated by the temperature change calculating unit 16, and N is a decrease amount calculated by the decrease amount calculating unit 18.

Accordingly, the judging unit 20 substitutes the electric energy and the like for Expression 3, and judges whether or not the relational expression is satisfied. In this case, as described above, it is sufficient for the judging unit 20 to judge whether or not the relational expression is satisfied within the tolerable range. Specifically, in the case where the tolerable range is taken as P (real number larger than 0), if the relation:

$$-P < (\Delta E \times \Delta t) - (A \times \Delta T + B \times N + C) < P \quad \text{Expression 4;}$$

is satisfied, the judging unit 20 may judge that the relational expression is satisfied within the tolerable range, and, if not, the judging unit 20 may judge that the relational expression is not satisfied within the tolerable range. If Expression 4 is not satisfied, one of:

$$(\Delta E \times \Delta t) \le (A \times \Delta T + B \times N + C) - P \quad \text{Expression 4-1; and}$$

$$(A \times \Delta T + B \times N + C) + P \le (\Delta E \times \Delta t) \quad \text{Expression 4-2;}$$

is satisfied. If Expression 4-1 is satisfied, the increase in the temperature is more than expected with respect to the supplied energy, and, thus, an abnormality such as thermal runaway or a decrease in the amount of the content 40 may have occurred. On the other hand, if Expression 4-2 is satisfied, the increase in the temperature is less than expected with respect to the supplied energy, and, thus, an abnormality such as microwave leakage or an increase in the amount of the content 40 may have occurred. In Expression 4, at least one of the inequality signs "<" may be a non-strict inequality sign "≤". Furthermore, in Expressions 4-1 and 4-2, at least one of the non-strict inequality signs "≤" may be a strict inequality sign "<".

Next, an operation of the information processing apparatus 1 will be described with reference to the flowchart in FIG. 3.

(Step S101) It is judged whether or not the electric power value accepting unit 11 has accepted the electric power value of the incident waves and the electric power value of the reflected waves from the power monitors 33. If accepted, the procedure advances to step S102, and, if not, the procedure advances to step S105. The electric power value accepting unit 11 preferably accepts the electric power value of the incident waves and the like per unit period as described above. The accepting the electric power value may be considered as importing an output value from the power monitors 33 into the information processing apparatus 1 per unit period.

(Step S102) The supplied electric power value calculating unit 12 calculates a supplied electric power value, using the electric power value of the incident waves and the electric power value of the reflected waves accepted by the electric power value accepting unit 11. If the electric power value accepting unit 11 has accepted the electric power value of the incident waves and the like from multiple power monitors 33, the supplied electric power value calculating unit 12 may calculate a supplied electric power value, by calculating differences between the electric power values of the incident waves and the like at the respective monitors, and adding the differences.

(Step S103) The supplied electric power value accepting unit 13 accepts the supplied electric power value calculated by the supplied electric power value calculating unit 12.

(Step S104) The supplied electric power value calculating unit 12 accumulates the accepted supplied electric power value in an unshown storage medium. The procedure returns to step S101.

(Step S105) It is judged whether or not the temperature accepting unit 15 has accepted the temperatures of the content 40. If accepted, the procedure advances to step S106, and, if not, the procedure advances to step S107. The temperature accepting unit 15 may accept the temperatures per unit period as described above. The accepting the temperatures may be considered as importing output values from the temperature measuring units 41 and 42 into the information processing apparatus 1 per unit period.

(Step S106) The temperature accepting unit 15 accumulates the accepted temperatures in the unshown storage medium. The procedure returns to step S101.

(Step S107) It is judged whether or not the evaporation amount accepting unit 17 has accepted the evaporation amount. If accepted, the procedure advances to step S108, and, if not, the procedure advances to step S109. The evaporation amount accepting unit 17 may accept the evaporation amount per unit period as described above. The accepting the evaporation amount may be considered as importing an evaporation amount from the evaporation amount acquiring unit 54 into the information processing apparatus 1 per unit period.

(Step S108) The evaporation amount accepting unit 17 accumulates the accepted evaporation amount in the unshown storage medium. The procedure returns to step S101.

(Step S109) The judging unit 20 judges whether or not to perform judgment using the relational expression. If judged to perform judgment using the relational expression, the procedure advances to step S110, and, if not, the procedure returns to step S101. For example, the judging unit 20 may judge to perform judgment using the relational expression at intervals of a predetermined period, or may judge to perform judgment using the relational expression at any other times.

(Step S110) The electric energy calculating unit 14 calculates an electric energy corresponding to the microwave irradiation time, using the supplied electric power values accumulated up till then. The electric energy may be stored in the unshown storage medium.

(Step S111) The temperature change calculating unit 16 calculates a temperature change corresponding to the microwave irradiation time, using the temperatures accumulated up till then. The temperature change may be stored in the unshown storage medium.

(Step S112) The decrease amount calculating unit 18 calculates a decrease amount corresponding to the microwave irradiation time, using the evaporation amounts accumulated up till then. The decrease amount may be stored in the unshown storage medium.

(Step S113) The judging unit 20 judges whether or not the relational expression stored in the relational expression storage unit 19 is satisfied within the tolerable range by the calculated electric energy, temperature change, and decrease amount. If satisfied, the procedure returns to step S101, and, if not, the procedure advances to step S114.

(Step S114) The output unit 21 performs output regarding occurrence of an abnormality in the microwave irradiation apparatus 2. The procedure returns to step S101.

Figure 3:
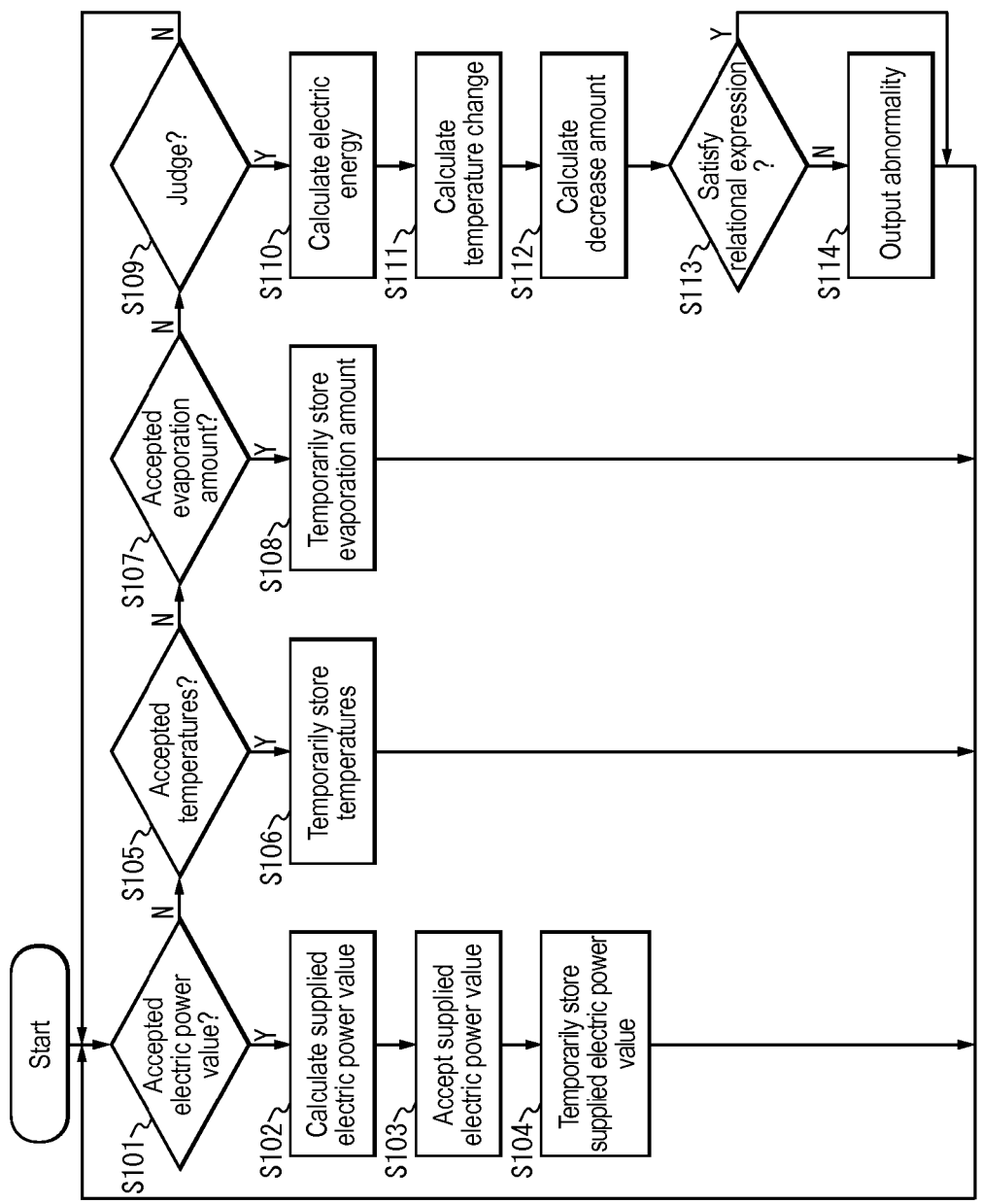
FIG. 3 is a flowchart showing an operation of the information processing apparatus according to this example.

In the flowchart in FIG. 3, also in the case where it is judged that the relational expression is satisfied within the tolerable range by the electric energy and the like, output regarding the judgment result may be performed. The flowchart in FIG. 3 shows a case in which the accepted supplied electric power value and the like are accumulated, and the electric energy and the like are calculated at a time using the accumulated supplied electric power value and the like, but there is no limitation to this. For example, the electric energy and the like may be calculated by sequentially adding the supplied electric power value and the like each time the supplied electric power value and the like are accepted. Note that the process is terminated by powering off or an interruption at completion of the process in the flowchart in FIG. 3.

Next, an operation of the microwave irradiation system 100 according to this example will be described by way of a specific example. In this specific example, it is assumed that the electric power value and the like are accepted on a regular basis at times T0, T1, T2, and ... in the information processing apparatus 1. A difference between adjacent times (e.g., "T2−T1") is a unit period. The unit period is taken as TU (s). Furthermore, in this specific example, it is assumed that the microwave irradiation time is 10 times the unit period. That is to say, the microwave irradiation time is 10×TU (s). Accordingly, for example, it is judged at the time T10 whether or not the relational expression is satisfied, using the information from the time T0 to the time T10. Furthermore, it is assumed that the evaporation amount acquired by the evaporation amount acquiring unit 54 is an accumulated amount.

It is assumed that, in a state where the information processing apparatus 1 and the microwave irradiation apparatus 2 operate, the time reaches T101. Then, the electric power value accepting unit 11 judges to accept the electric power value, accepts the electric power value of the incident waves and the electric power value of the reflected waves from two power monitors 33, and passes them to the supplied electric power value calculating unit 12 (Step S101). In this example, the electric power value of the incident waves from a first power monitor 33 is taken as PI101-1, and the electric power value of the reflected waves therefrom is taken as PR101-1. Furthermore, the electric power value of the incident waves from a second power monitor 33 is taken as PI101-2, and the electric power value of the reflected waves therefrom is taken as PR101-2. The supplied electric power value calculating unit 12 calculates an electric power value difference "(PI101-1)−(PR101-1)" at the first power monitor 33 and an electric power value difference "(PI101-2)−(PR101-2)" at the second power monitor 33. The supplied electric power value calculating unit 12 calculates a supplied electric power value "(PI101-1)−(PR101-1)+(PI101-2)−(PR101-2)", which is the total of the electric power value differences, and passes it to the supplied electric power value accepting unit 13 (Step S102). The supplied electric power value is taken as "E101". Upon accepting the supplied electric power value, the supplied electric power value accepting unit 13 accumulates the supplied electric power value in association with the time T101 in the unshown storage medium (Steps S103 and S104).

Also, the temperature accepting unit 15 judges to accept the temperatures at the time T101, accepts the temperature at the inlet position from the temperature measuring unit 41 and the temperature at the outlet position from the temperature measuring unit 42, and accumulates them in the unshown storage medium (Steps S105 and S106). The temperature at the inlet position is taken as TE101-1, and the temperature at the outlet position is taken as TE101-2. Also, the evaporation amount accepting unit 17 judges to accept the evaporation amount at the time T101, accepts the evaporation amount from the evaporation amount acquiring unit 54, and accumulates it in the unshown storage medium (Steps S107 and S108). The evaporation amount is taken as V101.

In this manner, the accumulation of the supplied electric power value and the like are sequentially performed also at the times T102, T103, and .... As a result, the information is stored in the unshown storage medium as shown in FIG. 4. In FIG. 4, each time is associated with the supplied electric power value (W), the temperature at the inlet position (° C.), the temperature at the outlet position (° C.), and the evaporation amount ($m^3$).

After the information such as supplied electric power value associated with the time T110 is accumulated, the judging unit 20 judges to perform judgment using the relational expression, and gives an instruction to calculate an electric energy to the electric energy calculating unit 14, gives an instruction to calculate a temperature change to the temperature change calculating unit 16, and gives an instruction to calculate a decrease amount to the decrease amount calculating unit 18 (Step S109). In response to the instruction, the electric energy calculating unit 14 calculates an electric energy "TU×(E101+E102+E103+ ... +E110)" according to the microwave irradiation time, and passes it to the judging unit 20 (Step S110). The electric energy is taken as "PS110". Furthermore, in response to the instruction from the judging unit 20, the temperature change calculating unit 16 calculates a temperature change "(TE110-2)−(TE100-1)" according to the microwave irradiation time, and passes it to the judging unit 20 (Step S111). The temperature change is taken as "TV110". Since the microwave irradiation time corresponds to the time during which the content 40 moves from the inlet position to the outlet position, an irradiation target positioned at the inlet position at the time T100 is positioned at the outlet position at the time T110 that is the time after the microwave irradiation time. Accordingly, a temperature change of the irradiation target in the microwave irradiation time is calculated by subtracting the temperature T100-1 of the content 40 at the inlet position at the time T100 from the temperature TE110-2 of the content 40 at the outlet position at the time T110. Furthermore, in response to the instruction from the judging unit 20, the decrease amount calculating unit 18 calculates a decrease amount "(V110−V100)×D/MO" according to the microwave irradiation time, and passes it to the judging unit 20 (Step S112). The decrease amount is taken as "RE110". Note that D is density ($kg/m^3$), and MO is the mass (kg) of evaporated material per mole. Accordingly, the decrease amount RE110 is the number of moles of the evaporated material. It is assumed that, with the above-described processing, the electric energy and the like corresponding to the microwave irradiation time (=10×TU (s)) from the time T100 to the time T110 have been calculated.

Figure 5A:
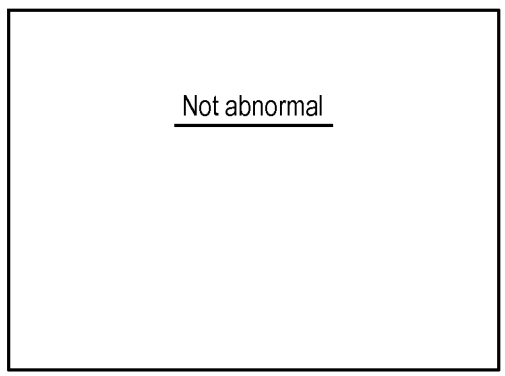
FIG. 5A is a view showing exemplary output according to this example.

Upon accepting the electric energy PS110, the temperature change TV110, and the decrease amount RE110, the judging unit 20 reads the relational expression from the relational expression storage unit 19, and judges whether or not:

$$-P < PS110 - (A \times TV110 + B \times RE110 + C) \quad \text{Expression 5; and}$$

$$PS110 - (A \times TV110 + B \times RE110 + C) < P \quad \text{Expression 6;}$$

are satisfied (Step S113). If both of Expressions 5 and 6 are satisfied, the relational expression is satisfied within the tolerable range by the electric energy and the like, if only one of the expressions is not satisfied, the relational expression is not satisfied within the tolerable range by the electric energy and the like. In this example, it is assumed that both of Expressions 5 and 6 are satisfied. The output unit 21 performs display as in FIG. 5A. As a result, the user of the microwave irradiation system 100 can see that no abnormality has occurred in the microwave irradiation apparatus 2.

Hereinafter, a case in which one of Expressions 5 and 6 is not satisfied will be briefly described. First, it is assumed that Expression 5 is not satisfied. In this case, an expected increase in the temperature is realized in spite of a small supplied energy, and, thus, thermal runaway or a decrease in the content 40 may have occurred. Accordingly, the output unit 21 may perform display as in FIG. 5B (Step S114). Next, it is assumed that Expression 6 is not satisfied. In this case, an expected increase in the temperature cannot be realized without increasing the supplied energy, and, thus, microwave leakage or an increase in the content 40 may have occurred. Accordingly, the output unit 21 may perform display as in FIG. 5C (Step S114).

In this specific example, the case was described in which the supplied electric power value, the temperature, the evaporation amount, and the like are accumulated in one storage medium, but there is no limitation to this. For example, the supplied electric power value, the temperature, and the like may be accumulated in different storage media. Furthermore, in this specific example, the temperatures used for calculating the temperature change and the evaporation amounts used for calculating the decrease amount are only those at the start and the end of the microwave irradiation time, and, thus, the temperature accepting unit 15 and the evaporation amount accepting unit 17 may accept only those at the start and the end thereof.

Furthermore, in this specific example, the case was described in which the electric power value accepting unit 11 accepts an electric power value itself of incident waves or the like, but there is no limitation to this. For example, the electric power value accepting unit 11 may accept a voltage value and a current value of incident waves or the like. Also in this case, an electric power value can be calculated by multiplying the voltage value and the current value, and, thus, it seems that the electric power value accepting unit 11 substantially accepts an electric power value.

As described above, with the microwave irradiation system 100 according to this example, an abnormality that will occur in the microwave irradiation region can be easily detected using the electric energy, the temperatures, and the evaporation amount that can be easily acquired in the microwave irradiation apparatus 2. Although it is not easy to detect thermal runaway, an increase or decrease in the content 40, or the like in the microwave irradiation apparatus 2, it is possible to easily detect that microwave irradiation is not properly performed, by judging whether or not the relational expression is satisfied by the electric energy and the like. As a result, if an abnormality has occurred, the abnormality can be dealt with.

In the foregoing example, the case was described in which the microwave irradiation apparatus 2 includes the microwave generators 31, the waveguides 32, the power monitors 33, the reactor 34, and the like as shown in FIG. 1, but there is no limitation to this. The microwave irradiation apparatus 2 may have any configuration at least including the microwave generator 31, the waveguide 32, the power monitor 33, and a microwave irradiation region, which is a region where a microwave irradiation target is to be irradiated with microwaves, and there is no limitation to the configuration shown in FIG. 1.

Furthermore, in the foregoing example, the case was mainly described in which the microwave irradiation apparatus 2 is of a flow through-type in which a microwave irradiation target flows inside the reactor 34, but there is no limitation to this. The flow through-type microwave irradiation apparatus 2 may be of a conveyor-type in which an irradiation target is moved by a conveyor in a microwave irradiation region. Furthermore, the microwave irradiation apparatus 2 may not be of a flow through-type, as described above. The microwave irradiation apparatus 2 may be of a batch-type. If the microwave irradiation apparatus 2 is of a batch-type, the temperature of the content may be measured only at one location or at two or more locations. In the latter case, the temperature accepting unit 15 may accept an average of temperatures measured at the two or more locations. The temperature change calculated by the temperature change calculating unit 16 may be a difference between the temperature after the temperature increases at the end of the microwave irradiation time and the temperature before the temperature increases at the start of the microwave irradiation time. The temperature change calculating unit 16 may calculate a temperature change, for example, using the temperature accepted by the temperature accepting unit 15 at the start of the microwave irradiation time and the temperature accepted by the temperature accepting unit 15 at the end of the microwave irradiation time. Furthermore, the electric energy calculating unit 14 may calculate an electric energy, for example, by sequentially integrating or adding supplied electric power values from the start to the end of the microwave irradiation time. Furthermore, the decrease amount calculating unit 18 may calculate a decrease amount, for example, by sequentially adding evaporation amounts per unit period from the start to the end of the microwave irradiation time, or may calculate a decrease amount, using an integrated evaporation amount accepted by the evaporation amount accepting unit 17 at the start of the microwave irradiation time and an integrated evaporation amount accepted by the evaporation amount accepting unit 17 at the end of the microwave irradiation time. Note that the electric energy calculating unit 14, the temperature change calculating unit 16, and the decrease amount calculating unit 18 may accept a start time and an end time of the microwave irradiation time, for example, from the microwave generators 31 or an unshown control unit or the like of the microwave generators 31, or may judge, as the start of the microwave irradiation time, a moment at which the electric power value or the supplied electric power value accepted by the electric power value accepting unit 11 or the supplied electric power value accepting unit 13 exceeds 0, and may judge, as the end of the microwave irradiation time, a moment at which the electric power value or the like is then becomes 0. Furthermore, the values of A, B, and C in the relational expression may change in accordance with the processing step. For example, if the processing is performed in order of Step 1, Step 2, and then Step 3 in the batch-type microwave irradiation apparatus 2, the coefficients (A, B, and C) in the relational expression may be A1, B1, and C1 in Step 1, may be A2, B2, and C2 in Step 2, and may be A3, B3, and C3 in Step 3. The judging unit 20 may judge whether or not the relational expression is satisfied within the tolerable range, using A1, B1, and C1, for the microwave irradiation time corresponding to Step 1, may judge whether or not the relational expression is satisfied within the tolerable range, using A2, B2, and C2, for the microwave irradiation time corresponding to Step 2, and may judge whether or not the relational expression is satisfied within the tolerable range, using A3, B3, and C3, for the microwave irradiation time corresponding to Step 3.

Furthermore, in the foregoing example, the case was described in which occurrence of an abnormality is detected in the range from the inlet position to the outlet position in the continuous-type microwave irradiation apparatus 2, that is, in the entire reactor 34, but there is no limitation to this. For example, if the reactor 34 is divided into multiple areas (e.g., chambers, etc.), occurrence of an abnormality may be detected in each chamber. In this case, the processing may be performed such that each area targeted for detection corresponds to the entire reactor 34 described above. That is to say, temperatures at the inlet position and the outlet position of each area targeted for detection are used instead of the temperatures at the inlet position and the outlet position of the reactor, a microwave irradiation time, which is a time during which the content flows in that area, is used, a supplied electric power value regarding microwaves irradiated on that area is used, and an evaporation amount evaporated from that area is used.

Furthermore, in the foregoing example, the case was described in which the electric power value accepting unit 11 accepts the electric power value from the power monitors 33, the temperature accepting unit 15 accepts the temperatures from the temperature measuring units 41 and 42, and the evaporation amount accepting unit 17 accepts the evaporation amount from the evaporation amount acquiring unit 54, but there is no limitation to this. For example, the electric power value accepting unit 11 and the like may accept the temperatures and the like from an apparatus for managing information such as the temperatures regarding the microwave irradiation apparatus 2, or may accept the temperatures and the like manually input by the user.

Furthermore, in the foregoing example, the case was described in which the temperature measuring units 41 and 42 are arranged inside the reactor 34, but there is no limitation to this. It is sufficient that the temperature measuring units 41 and 42 can measure temperatures of the content 40 at the inlet position and the outlet position of the reactor 34, and, thus, for example, the temperature measuring unit 41 may measure a temperature of the content 40 immediately before the content 40 flows into the reactor 34, and the temperature measuring unit 42 may measure a temperature of the content 40 immediately after the content 40 flows out of the reactor 34.

Figure 6A:
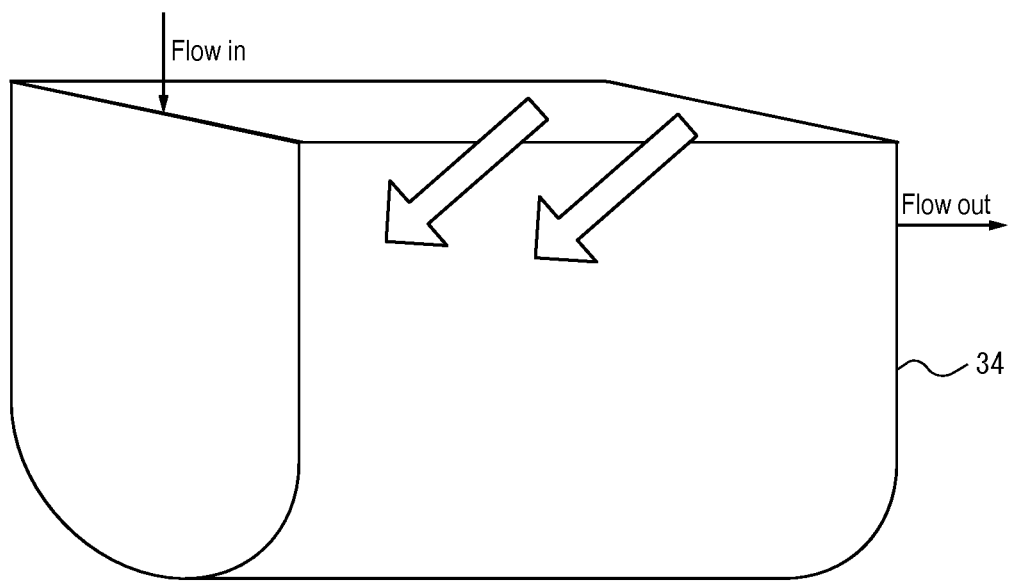
FIG. 6A is a view showing an exemplary microwave irradiation region according to this example.
Figure 6B:
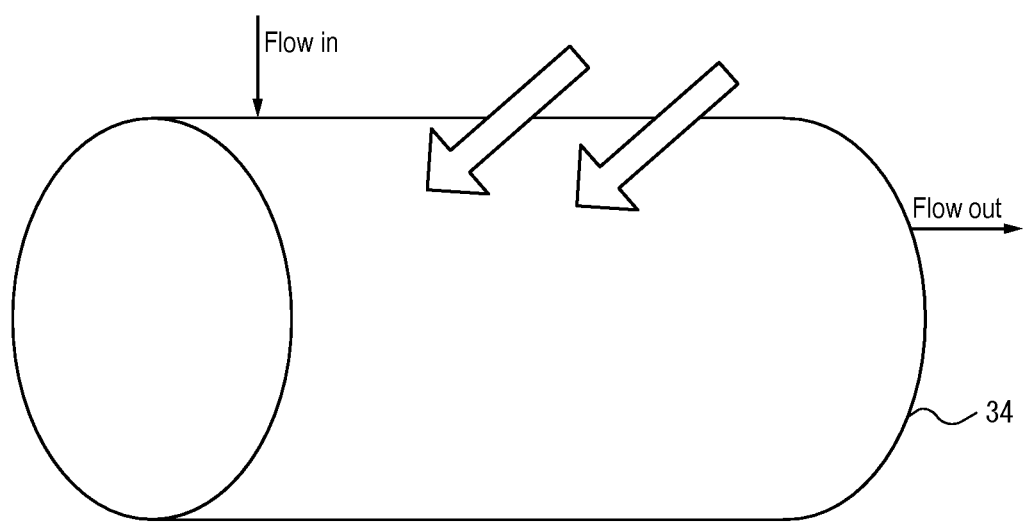
FIG. 6B is a view showing an exemplary microwave irradiation region according to this example.
Figure 6C:
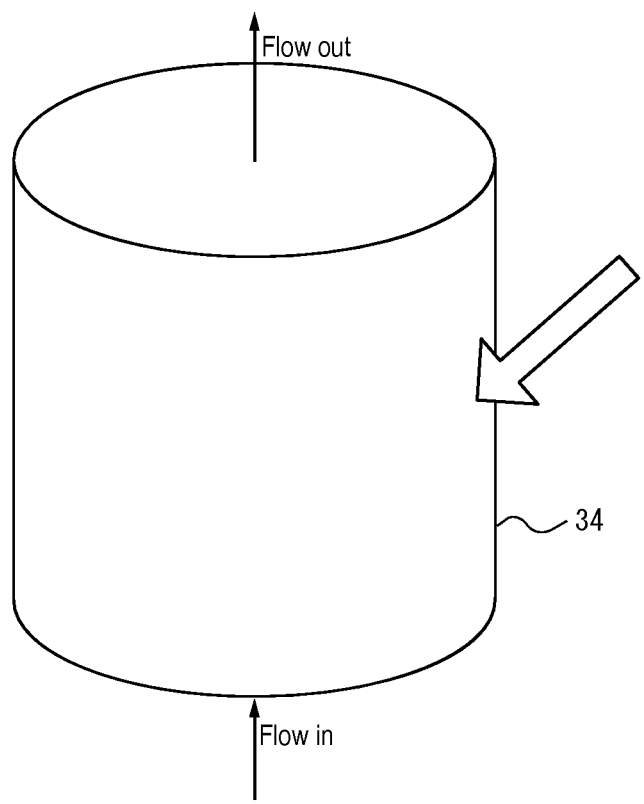
FIG. 6C is a view showing an exemplary microwave irradiation region according to this example.

Furthermore, in the foregoing example, as described above, there is no limitation on the shape or the format of the microwave irradiation region. For example, the microwave irradiation apparatus 2 may have a reactor 34 that is a microwave irradiation region shown in FIGS. 6A to 6C, where each reactor 34 is of a flow through-type and the inlet position and the outlet position of a microwave irradiation target are indicated by the arrows in the drawings. Note that the reactors 34 in FIGS. 6A and 6B are of a horizontal flow through-type, and the reactor 34 in FIG. 6C is of a vertical flow through-type. In this manner, if the microwave irradiation apparatus 2 is of a continuous-type, the microwave irradiation target may flow in a horizontal direction, in a vertical direction, or in other directions. Furthermore, the microwaves may be irradiated as indicated by the thick arrows in the drawings.

Figure 7:
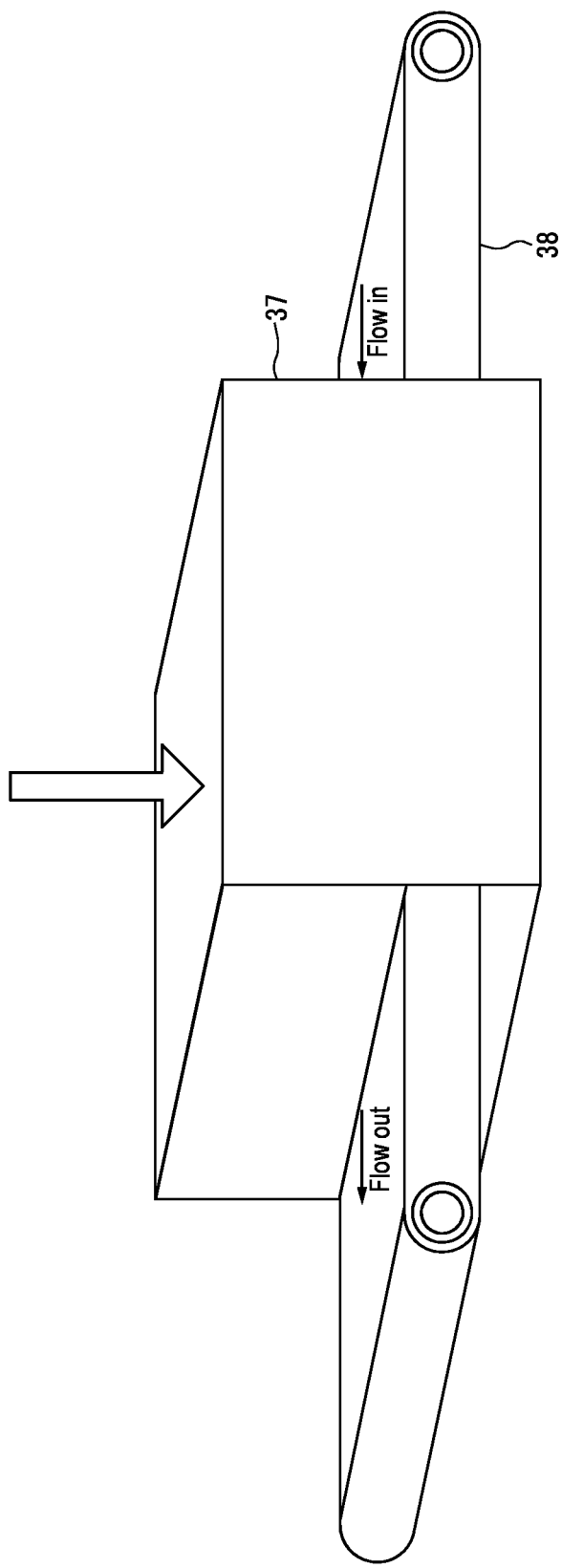
FIG. 7 is a view showing an exemplary microwave irradiation region according to this example.

Furthermore, for example, the microwave irradiation apparatus 2 may have a microwave irradiation region 37 shown in FIG. 7. In the microwave irradiation apparatus 2 in FIG. 7, a microwave irradiation target is conveyed by a belt conveyor 38, and is irradiated with microwaves in the microwave irradiation region 37. The inlet position and the outlet position into and from the microwave irradiation region are indicated by the arrows in the drawing. Furthermore, the microwaves may be irradiated as indicated by the thick arrow in the drawing.

Figure 8:
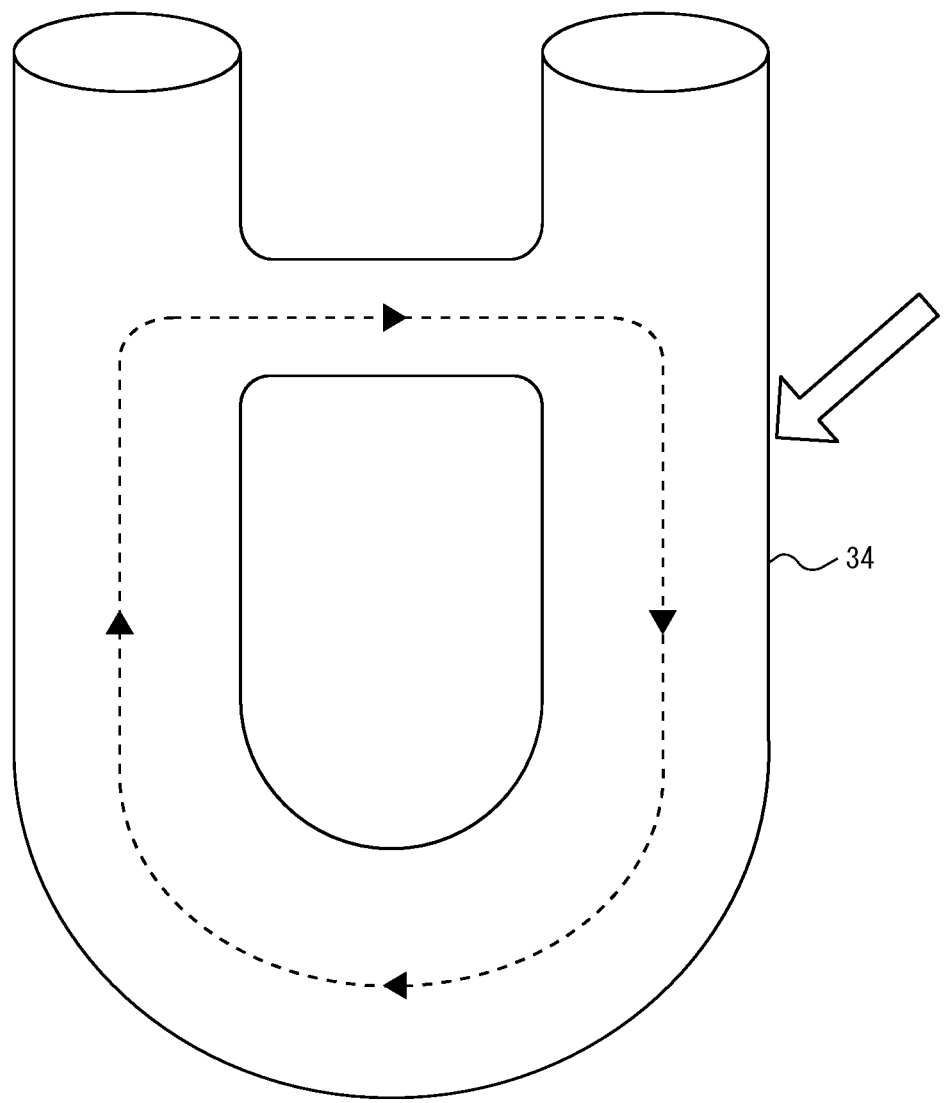
FIG. 8 is a view showing an exemplary microwave irradiation region according to this example.

Furthermore, for example, the microwave irradiation apparatus 2 may have a reactor 34 that is a microwave irradiation region shown in FIG. 8. The reactor 34 in FIG. 8 is of a batch-type. Furthermore, a microwave irradiation target may be circulated inside the reactor 34 by an unshown agitation unit in the flow direction indicated by the broken line in the drawing. Furthermore, the microwaves may be irradiated as indicated by the thick arrow in the drawing. Furthermore, it will be appreciated that the reactors 34 shown in FIGS. 6A to 6C may be used as a batch-type reactor.

Furthermore, as described above, the material that is to be irradiated with microwaves by the microwave irradiation apparatus 2 may be solid, liquid, gas, or a mixture of any two or more of these. Furthermore, if the microwave irradiation target is solid or liquid, the solid or liquid may be directly irradiated with microwaves, or may be indirectly irradiated with microwaves via a space such as the unfilled space 35 described above.

Furthermore, in the foregoing example, the case was described in which an evaporation amount is acquired using the vapor guide tube 51, the condensing vessel 52, the liquid surface sensor 53, and the evaporation amount acquiring unit 54, but it will be appreciated that the evaporation amount of the content may be acquired using other units as long as the evaporation amount of the content can be acquired.

Furthermore, in the foregoing example, the case was described in which the evaporation amount is also used, but there is no limitation to this. If the evaporation amount substantially does not change or if the content is not evaporated, the judgment may be performed without consideration of the evaporation amount. That is to say, the relational expression may be for associating the electric energy and the temperature change. The judging unit 20 may, using the electric energy calculated by the electric energy calculating unit 14, the temperature change calculated by the temperature change calculating unit 16, and the relational expression, judge whether or not the relational expression is satisfied within the tolerable range by the electric energy and the temperature change. The judgment processing is realized merely by setting B to 0 in the above-described relational expression, and, thus, a detailed description of the case not using the evaporation amount has been omitted. Furthermore, the output unit 21 may perform output regarding occurrence of an abnormality if the judging unit 20 judges that the relational expression is not satisfied within the tolerable range by the electric energy and the temperature change. If the evaporation amount is not used, the information processing apparatus 1 may not include the evaporation amount accepting unit 17 and the decrease amount calculating unit 18. The microwave irradiation apparatus 2 may not include the vapor guide tube 51, the condensing vessel 52, the liquid surface sensor 53, and the evaporation amount acquiring unit 54.

Furthermore, in the foregoing example, the case was described in which a supplied electric power value is calculated in the information processing apparatus 1, but the supplied electric power value may be calculated in the power monitors 33 or may be calculated by a calculating apparatus or the like positioned between the power monitors 33 and the information processing apparatus 1. In this manner, if the supplied electric power value is calculated by a unit other than the information processing apparatus 1, the information processing apparatus 1 may not include the electric power value accepting unit 11 and the supplied electric power value calculating unit 12. The supplied electric power value accepting unit 13 may accept the supplied electric power value calculated by a unit other than the information processing apparatus 1. In this case, for example, the supplied electric power value accepting unit 13 may accept a supplied electric power value input from an input device (e.g., a keyboard, a mouse, a touch panel, etc.), may receive a supplied electric power value transmitted via a wired or wireless communication line, or may accept a supplied electric power value read from a predetermined storage medium (e.g., an optical disk, a magnetic disk, a semiconductor memory, etc.).

Furthermore, in the foregoing example, the case was mainly described in which the coefficients A, B, and C in Expression 3 and the like are measured in an experiment, but there is no limitation to this. The coefficients A, B, and C may be obtained by calculation.

Furthermore, in the foregoing example, the case was described in which the information processing apparatus 1 is a stand-alone apparatus, but the information processing apparatus 1 may be either a stand-alone apparatus or a server apparatus in a server-client system. In the latter case, the output unit and the accepting unit may use a communication line to accept input, or to output information.

Furthermore, in the foregoing example, each processing or each function may be realized as integrated processing using a single apparatus or a single system, or may be realized as distributed processing using multiple apparatuses or multiple systems.

Furthermore, in the foregoing example, information transmission performed between constituent elements may be such that, for example, if two constituent elements for transmitting information are physically different from each other, the transmission is performed by one of the constituent elements outputting the information and the other constituent element accepting the information, or alternatively, if two constituent elements for transmitting information are physically the same, the transmission is performed by shifting from a processing phase corresponding to one of the constituent elements to a processing phase corresponding to the other constituent element.

Furthermore, in the foregoing example, information relating to the processing performed by each constituent element, for example, information that is to be accepted, acquired, selected, produced, transmitted, or received by each constituent element, information such as a threshold value, a numerical expression, or an address used by each constituent element in the processing and the like may be retained in an unshown storage medium temporarily or for a long period of time even if not specified in the description above. Furthermore, information may be accumulated in the unshown storage medium by each constituent element or by an unshown accumulating unit. Furthermore, information may be read from the unshown storage medium by each constituent element or by an unshown reading unit.

Furthermore, in the foregoing example, if information used in each constituent element or the like, for example, information such as a threshold value, an address, or various setting values used in each constituent element in the processing may be changed by a user, the user may change such information as appropriate even if not specified in the description above, but there is no limitation to this. If the user may change such information, the change may be realized by, for example, an unshown accepting unit that accepts a change instruction from the user and an unshown changing unit that changes information according to the change instruction. The change instruction may be accepted by the unshown accepting unit, for example, by accepting information from an input device, by receiving information transmitted via a communication line, or by accepting information read from a predetermined storage medium.

Furthermore, in the foregoing example, if two or more constituent elements included in the information processing apparatus 1 have a communication device, an input device, or the like, the two or more constituent elements may have a physically single device, or may have different devices.

Furthermore, in the foregoing example, each constituent element may be configured by dedicated hardware, or alternatively, constituent elements that can be realized as software may be realized by executing a program. For example, each constituent element may be realized by a program execution unit such as a CPU reading and executing a software program stored in a storage medium such as a hard disk or a semiconductor memory. At the time of executing the program, the program execution unit may execute the program while accessing the storage unit or the storage medium. The software that realizes the information processing apparatus in the foregoing example may be the following sort of program. Specifically, this program is a program for causing a computer to perform judgment regarding an abnormality in a microwave irradiation apparatus for irradiating microwaves on a content, causing the computer to execute: a supplied electric power value accepting step of accepting a supplied electric power value to the microwave irradiation apparatus, which is a difference between an electric power value of incident waves that are microwaves incident on an irradiation region of the microwave irradiation apparatus and an electric power value of reflected waves that are microwaves reflected by the irradiation region of the microwave irradiation apparatus; a temperature accepting step of accepting a temperature of the content; an electric energy calculating step of calculating an electric energy corresponding to a microwave irradiation time, using the supplied electric power value accepted in the supplied electric power value accepting step; a temperature change calculating step of calculating a temperature change corresponding to the microwave irradiation time, using the temperature accepted in the temperature accepting step; a judging step of, using the electric energy calculated in the electric energy calculating step, the temperature change calculated in the temperature change calculating step, and a relational expression for associating the electric energy and the temperature change, judging whether or not the relational expression is satisfied within a tolerable range by the electric energy and the temperature change; and an output step of performing output regarding occurrence of an abnormality, in a case where it is judged in the judging step that the relational expression is not satisfied within the tolerable range by the electric energy and the temperature change.

In the program, the functions realized by the program do not include functions that can be realized only by hardware. For example, functions that can be realized only by hardware, such as a modem or an interface card, in an accepting unit that accepts information or an output unit that outputs information are not at least included in the functions realized by the above-described program.

Furthermore, this program may be executed by downloading from a server or the like, or may be executed by reading a program stored in a predetermined storage medium (e.g., an optical disk such as a CD-ROM, a magnetic disk, a semiconductor memory, etc.). Furthermore, the program may be used as a program forming a program product.

Furthermore, a computer that executes the program may be a single computer or may be multiple computers. That is to say, integrated processing may be performed, or distributed processing may be performed.

Figure 9:
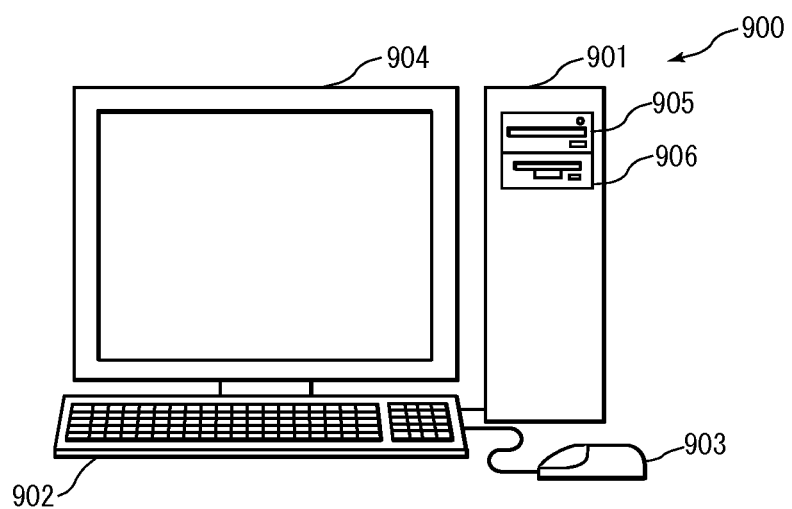
FIG. 9 is a schematic view showing an exemplary appearance of a computer system according to this example.

FIG. 9 is a schematic view showing an exemplary appearance of a computer that executes the program described above to realize the information processing apparatus 1 in the foregoing example. The foregoing example may be realized using computer hardware and computer programs executed thereon.

In FIG. 9, a computer system 900 is provided with a computer 901 including a compact disk read only memory (CD-ROM) drive 905 and a Floppy (registered trademark) Disk (FD) drive 906, a keyboard 902, a mouse 903, and a monitor 904.

Figure 10:
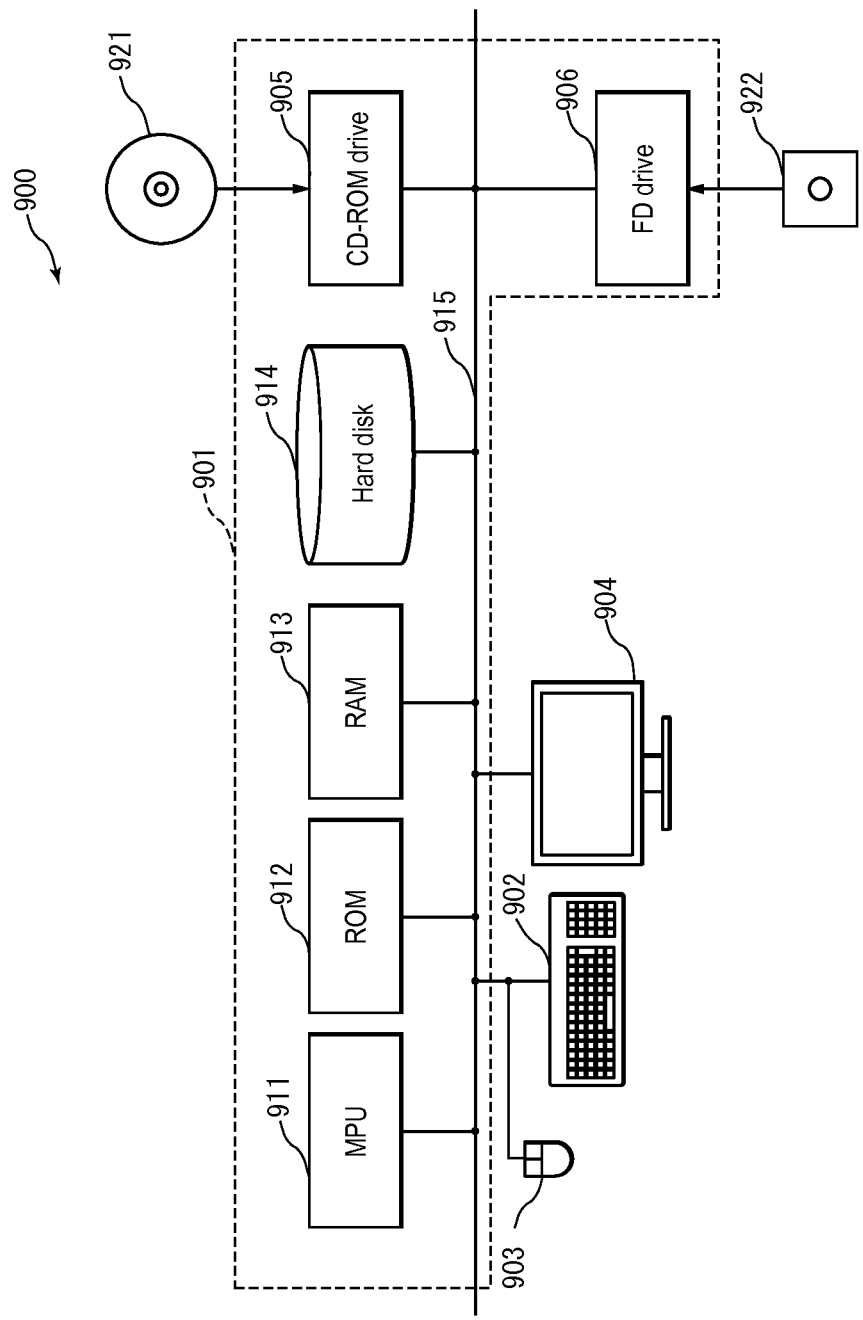
FIG. 10 is a diagram showing an example of the configuration of the computer system according to this example.

FIG. 10 is a diagram showing an internal configuration of the computer system 900. In FIG. 10, the computer 901 is provided with, in addition to the CD-ROM drive 905 and the FD drive 906, a micro processing unit (MPU) 911, a ROM 912 in which a program such as a boot up program is to be stored, a random access memory (RAM) 913 that is connected to the MPU 911 and in which a command of an application program is temporarily stored and a temporary storage area is to be provided, a hard disk 914 in which an application program, a system program, and data are stored, and a bus 915 that connects the MPU 911, the ROM 912, and the like. Note that the computer 901 may include an unshown network card for providing a connection to a LAN, a WAN, or the like.

The program for causing the computer system 900 to execute the functions of the information processing apparatus 1 in the foregoing example may be stored in a CD-ROM 921 or an FD 922 that is inserted into the CD-ROM drive 905 or the FD drive 906, and be transmitted to the hard disk 914. Alternatively, the program may be transmitted via an unshown network to the computer 901 and stored in the hard disk 914. At the time of execution, the program is loaded into the RAM 913. The program may be loaded from the CD-ROM 921 or the FD 922, or directly from a network.

The program does not necessarily have to include, for example, an operating system (OS) or a third party program to cause the computer 901 to execute the functions of the information processing apparatus 1 in the foregoing example. The program may only include a command portion to call an appropriate function (module) in a controlled mode and obtain desired results. The manner in which the computer system 900 operates is well known, and, thus, a detailed description thereof has been omitted.

The present invention is not limited to the example set forth herein. Various modifications are possible within the scope of the invention.

As described above, the information processing apparatus and the like according to the present invention are effective in that an abnormality that has occurred in a microwave irradiation apparatus can be detected, and, thus, they are useful, for example, as a safety apparatus for monitoring the microwave irradiation apparatus.

The invention claimed is:

1. An information processing apparatus for performing judgment regarding an abnormality in a microwave irradiation apparatus for irradiating microwaves on a content, the information processing apparatus comprising:

a supplied electric power value accepting unit that accepts a supplied electric power value to the microwave irradiation apparatus, which is a difference between an electric power value of incident waves that are microwaves incident on an irradiation region of the microwave irradiation apparatus and an electric power value of reflected waves that are microwaves reflected by the irradiation region of the microwave irradiation apparatus;

a temperature accepting unit that accepts a temperature of the content;

an electric energy calculating unit that calculates an electric energy corresponding to a microwave irradiation time, using the supplied electric power value accepted by the supplied electric power value accepting unit;

a temperature change calculating unit that calculates a temperature change corresponding to the microwave irradiation time, using the temperature accepted by the temperature accepting unit;

a judging unit that, using the electric energy calculated by the electric energy calculating unit, the temperature change calculated by the temperature change calculating unit, and a relational expression for associating the electric energy and the temperature change, judges whether or not the relational expression is satisfied within a tolerable range by the electric energy and the temperature change; and an output unit that performs output regarding occurrence of an abnormality, in a case where it is judged by the judging unit that the relational expression is not satisfied within the tolerable range by the electric energy and the temperature change.

2. The information processing apparatus according to claim 1, further comprising:

an evaporation amount accepting unit that accepts an evaporation amount of the content in the irradiation region of the microwave irradiation apparatus; and a decrease amount calculating unit that calculates a decrease amount of the content due to evaporation, corresponding to the microwave irradiation time, using the evaporation amount accepted by the evaporation amount accepting unit;

wherein the relational expression is for associating the electric energy, the temperature change, and the decrease amount, the judging unit, using the electric energy calculated by the electric energy calculating unit, the temperature change calculated by the temperature change calculating unit, the decrease amount calculated by the decrease amount calculating unit, and the relational expression, judges whether or not the relational expression is satisfied within the tolerable range by the electric energy, the temperature change, and the decrease amount, and the output unit performs the output, in a case where it is judged by the judging unit that the relational expression is not satisfied within the tolerable range by the electric energy, the temperature change, and the decrease amount.

3. The information processing apparatus according to claim 1, wherein the microwave irradiation apparatus is of a continuous-type, the temperature accepting unit accepts a temperature of the content at an inlet position of the microwave irradiation apparatus and a temperature of the content at an outlet position thereof, the temperature change calculating unit calculates the temperature change, which is a difference between the temperature of the content at the outlet position and the temperature of the content at the inlet position, and the microwave irradiation time is a time during which the content flows in the irradiation region of the microwave irradiation apparatus.

4. The information processing apparatus according to claim 1,
wherein the microwave irradiation apparatus is of a batch-type,
the temperature change calculating unit calculates the temperature change, which is a difference between the temperature after the temperature increases at an end of the microwave irradiation time and the temperature before the temperature increases at a start of the microwave irradiation time.

5. An information processing method for performing judgment regarding an abnormality in a microwave irradiation apparatus for irradiating microwaves on a content, the information processing method comprising:
a supplied electric power value accepting step of accepting at a supplied electric power value accepting unit a supplied electric power value to the microwave irradiation apparatus, which is a difference between an electric power value of incident waves that are microwaves incident on an irradiation region of the microwave irradiation apparatus and an electric power value of reflected waves that are microwaves reflected by the irradiation region of the microwave irradiation apparatus;
a temperature accepting step of accepting at a temperature accepting unit a temperature of the content;
an electric energy calculating step of calculating, by an electric energy calculating unit, an electric energy corresponding to a microwave irradiation time, using the supplied electric power value accepted in the supplied electric power value accepting step;
a temperature change calculating step of calculating, by a temperature change calculating unit, a temperature change corresponding to the microwave irradiation time, using the temperature accepted in the temperature accepting step;
a judging step of, using the electric energy calculated in the electric energy calculating step, the temperature change calculated in the temperature change calculating step, and a relational expression for associating the electric energy and the temperature change, judging by a judging unit whether or not the relational expression is satisfied within a tolerable range by the electric energy and the temperature change; and
an output step of performing, by an output unit, output regarding occurrence of an abnormality, in a case where it is judged in the judging step that the relational expression is not satisfied within the tolerable range by the electric energy and the temperature change.

6. A non-transitory computer-readable medium embodying a program for causing a computer to perform judgment regarding an abnormality in a microwave irradiation apparatus for irradiating microwaves on a content, the program causing the computer to execute:
a supplied electric power value accepting step of accepting at a supplied electric power value accepting unit a supplied electric power value to the microwave irradiation apparatus, which is a difference between an electric power value of incident waves that are microwaves incident on an irradiation region of the microwave irradiation apparatus and an electric power value of reflected waves that are microwaves reflected by the irradiation region of the microwave irradiation apparatus;
a temperature accepting step of accepting at a temperature accepting unit a temperature of the content;
an electric energy calculating step of calculating, by an electric energy calculating unit, an electric energy corresponding to a microwave irradiation time, using the supplied electric power value accepted in the supplied electric power value accepting step;
a temperature change calculating step of calculating, by a temperature change calculating unit, a temperature change corresponding to the microwave irradiation time, using the temperature accepted in the temperature accepting step;
a judging step of, using the electric energy calculated in the electric energy calculating step, the temperature change calculated in the temperature change calculating step, and a relational expression for associating the electric energy and the temperature change, judging by a judging unit whether or not the relational expression is satisfied within a tolerable range by the electric energy and the temperature change; and
an output step of performing, by an output unit, output regarding occurrence of an abnormality, in a case where it is judged in the judging step that the relational expression is not satisfied within the tolerable range by the electric energy and the temperature change.

7. The information processing apparatus according to claim 2,
wherein the microwave irradiation apparatus is of a continuous-type,
the temperature accepting unit accepts a temperature of the content at an inlet position of the microwave irradiation apparatus and a temperature of the content at an outlet position thereof,
the temperature change calculating unit calculates the temperature change, which is a difference between the temperature of the content at the outlet position and the temperature of the content at the inlet position, and
the microwave irradiation time is a time during which the content flows in the irradiation region of the microwave irradiation apparatus.

8. The information processing apparatus according to claim 2,
wherein the microwave irradiation apparatus is of a batch-type,
the temperature change calculating unit calculates the temperature change, which is a difference between the temperature after the temperature increases at an end of the microwave irradiation time and the temperature before the temperature increases at a start of the microwave irradiation time.

* * * * *